(12) United States Patent
Koser et al.

(10) Patent No.: US 9,258,914 B2
(45) Date of Patent: Feb. 9, 2016

(54) HINGE ASSEMBLY

(71) Applicant: Intel Corporation, Santa Clara, CA (US)

(72) Inventors: Alanna M. Koser, Tacoma, WA (US); Robert R. Atkinson, Jr., Chandler, AZ (US); Ralph V. Miele, DuPont, WA (US); Anthony P. Valpiani, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/126,247

(22) PCT Filed: Jul. 30, 2013

(86) PCT No.: PCT/US2013/052751
§ 371 (c)(1),
(2) Date: Dec. 13, 2013

(87) PCT Pub. No.: WO2015/016838
PCT Pub. Date: Feb. 5, 2015

(65) Prior Publication Data
US 2015/0305185 A1 Oct. 22, 2015

(51) Int. Cl.
*G06F 1/16* (2006.01)
*H05K 5/02* (2006.01)

(52) U.S. Cl.
CPC ............ *H05K 5/0226* (2013.01); *G06F 1/1633* (2013.01)

(58) Field of Classification Search
USPC .......... 455/575.1, 129, 418, 575.3, 347, 90.3, 455/571, 572, 432.3; 312/319.2, 326, 7.2, 312/405, 323, 223.2, 223.3; 16/337, 321, 16/334, 319, 341, 320, 374, 412, 408, 386, 16/366; 248/278.1, 683, 70, 688; 361/679.55, 679.31, 679.09, 679.02, 361/679.27, 679.28, 679.59, 679.26, 361/679.33, 679.21, 679.22, 679.54, 361/679.16, 679.6, 679.11
See application file for complete search history.

(56) References Cited

U.S. PATENT DOCUMENTS

2004/0093447 A1  5/2004  Numano
2013/0038996 A1  2/2013  Griffin et al.
(Continued)

FOREIGN PATENT DOCUMENTS

EP        2 311 736 A1      4/2011
KR       10-0699748 B1      3/2007
KR     10-2011-0091221 A    8/2011

OTHER PUBLICATIONS

International Search Report and Written Opinion received for PCT Patent Application No. PCT/US2013/052751, mailed on Apr. 29, 2014, 11 pages.

*Primary Examiner* — Hung Duong
(74) *Attorney, Agent, or Firm* — Alpine Technology Law Group LLC

(57) ABSTRACT

In one embodiment chassis for an electronic device comprises a first section and a second section and an assembly to connect a first section of the chassis to a second section of the chassis, comprising a hinge assembly to be coupled between the first section of the chassis and the second section of the chassis to allow rotation of the second section of the chassis with respect to the first section of the chassis, and a translation assembly to be coupled to the hinge assembly of the chassis for the electronic device to allow translation of the second section of the chassis with respect to the first section of the chassis, wherein rotation of the hinge assembly activates the translation assembly. Other embodiments may be described.

21 Claims, 17 Drawing Sheets

(56) References Cited

U.S. PATENT DOCUMENTS

2014/0293534 A1* 10/2014 Siddiqui .................. 361/679.55
2015/0002998 A1* 1/2015 Arima et al. ............. 361/679.27
2015/0092331 A1* 4/2015 Kinoshita et al. ........ 361/679.09

* cited by examiner

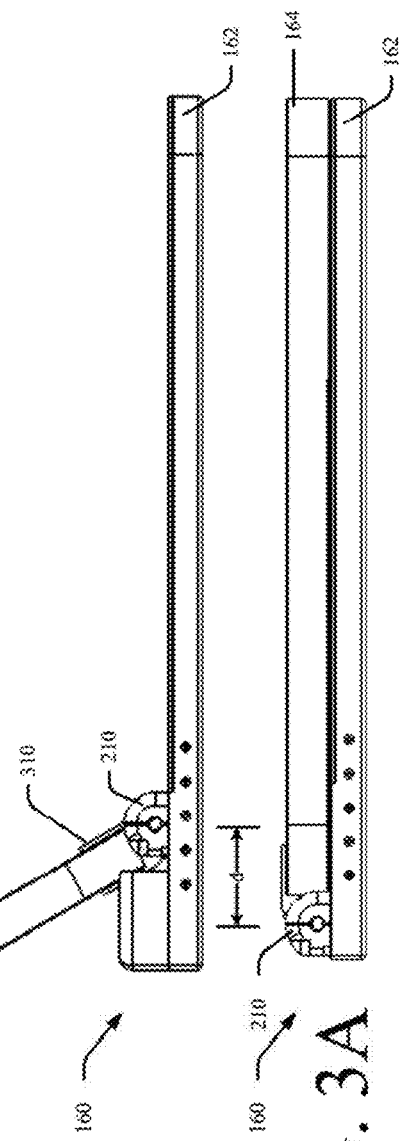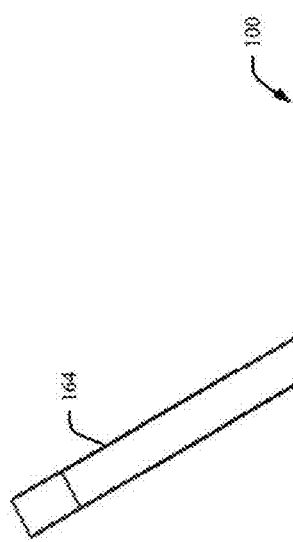

HINGE ASSEMBLY

BACKGROUND

The subject matter described herein relates generally to the field of electronic devices and more particularly to one or more hinge assemblies which may be used with electronic devices.

Some electronic devices utilize a notebook chassis. By way of example, many portable computers (e.g. traditional laptop, detachable, or convertible) and mobile electronic devices utilize a notebook chassis in which a keyboard is disposed on a first section and a display is disposed on a second section which is coupled to the first section by a hinge. Alternatively, a "clamshell" style laptop can consist of displays, e.g. at least one display on a first section and possibly one or more displays, that can also be utilized as a touch keyboard, on a second section coupled to the first section by a hinge.

Touch screen user interfaces are becoming increasingly common with all electronic devices, and most notably with mobile devices that can operate in tablet mode. In some instances, touch screen operation may cause the display to oscillate due to the force applied to the screen by the user. Accordingly, assemblies which connect a display to a base on a chassis for an electronic device may find utility.

BRIEF DESCRIPTION OF THE DRAWINGS

The detailed description references the accompanying figures.

FIGS. 3A-3B are schematic illustrations of electronic devices which include a hinge assembly in accordance with some embodiments.

DETAILED DESCRIPTION

In the following description, numerous specific details are set forth to provide a thorough understanding of various embodiments. However, it will be understood by those skilled in the art that the various embodiments may be practiced without the specific details. In other instances, well-known methods, procedures, components, and circuits have not been illustrated or described in detail so as not to obscure the particular embodiments.

Figure 1:
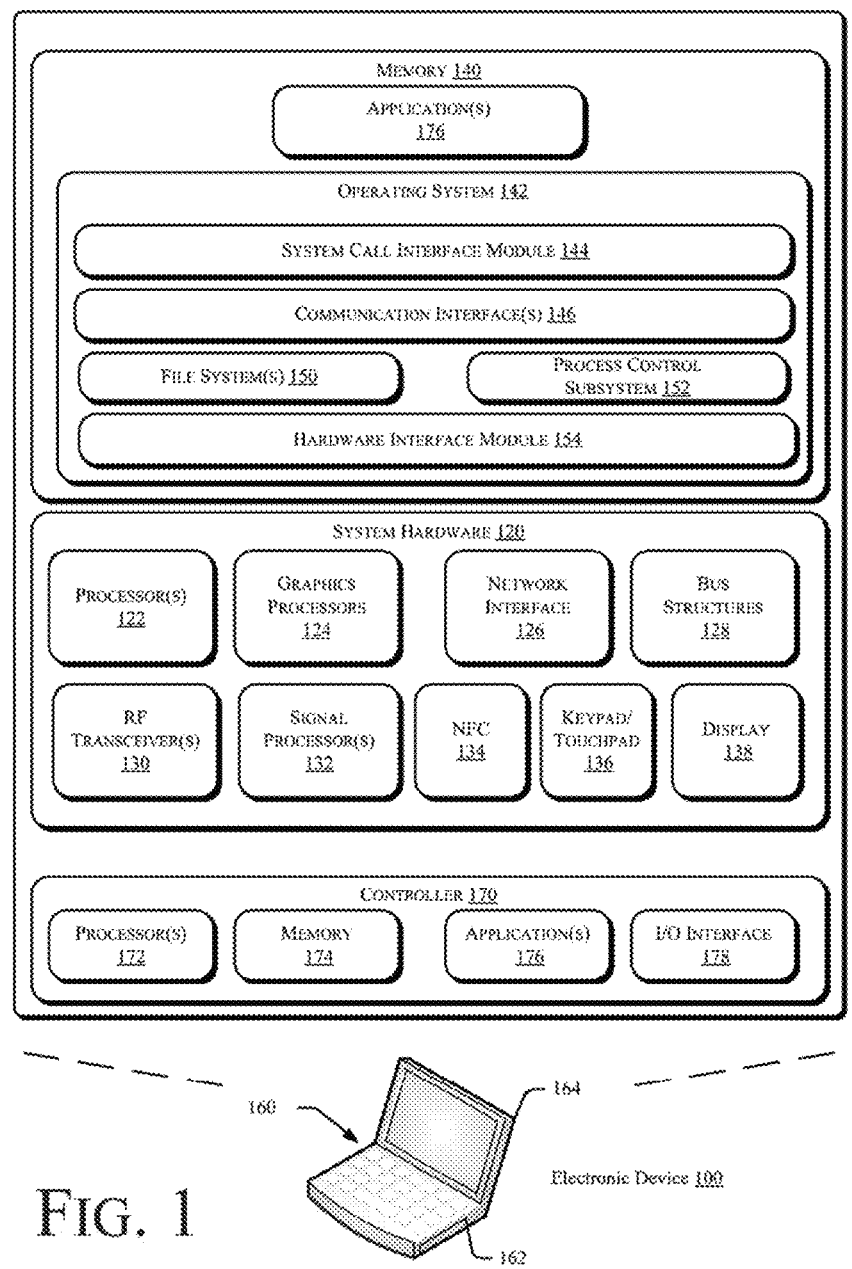
FIG. 1 is a schematic illustration of an exemplary electronic device which may include a hinge assembly in accordance with some embodiments.

FIG. 1 is a schematic illustration of an exemplary electronic device 100 which may be adapted to include a hinge assembly which manages the rotation of a display on a notebook chassis having a first section 160 and a second section 162 in accordance with some embodiments. As illustrated in FIG. 1, electronic device 100 may be embodied as a conventional portable device such as a laptop computer, a mobile phone, tablet computer portable computer, or personal digital assistant (PDA). The particular device configuration is not critical.

In various embodiments, electronic device 100 may include or be coupled to one or more accompanying input/output devices including a display, one or more speakers, a keyboard, one or more other I/O device(s), a mouse, a camera, or the like. Other exemplary I/O device(s) may include a touch screen, a voice-activated input device, a track ball, a geolocation device, an accelerometer/gyroscope, biometric feature input devices, and any other device that allows the electronic device 100 to receive input from a user.

The electronic device 10 includes system hardware 120 and memory 140, which may be implemented as random access memory and/or read-only memory. A file store may be communicatively coupled to electronic device 100. The file store may be internal to electronic device 100 such as, e.g., eMMC, SSD, one or more hard drives, or other types of storage devices. The file store may also be external to electronic device 100 such as, e.g., one or more external hard drives, network attached storage, or a separate storage network.

System hardware 120 may include one or more processors 122, graphics processors 124, network interfaces 126, and bus structures 128. In one embodiment, processor 122 may be embodied as an Intel® Atom™ processors. Intel® Atom™ based System-on-a-Chip (SOC) or Intel® Core2 Duo® or i3/i5/i7 series processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics processor(s) 124 may function as adjunct processor that manages graphics and/or video operations. Graphics processor(s) 124 may be integrated onto the motherboard of electronic device 100 or may be coupled via an expansion slot on the motherboard or may be located on the same die or same package as the Processing Unit.

In one embodiment, network interface 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.110-2003). Another example of a wireless interface would be a general packet radio service (GPRS) interface (see, e.g., Guidelines on GPRS Handset Requirements, Global System for Mobile Communications/GSM Association. Ver. 3.0.1, December 2002).

Bus structures 128 connect various components of system hardware 128. In one embodiment, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA). Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI), a High Speed Synchronous Serial Interface (HSI), a Serial Low-power Inter-chip Media Bus (SLIMbus®), or the like.

Electronic device 100 may include an RF transceiver 130 to transceive RF signals, a Near Field Communication (NFC) radio 134, and a signal processing module 132 to process signals received by RF transceiver 130. RF transceiver may implement a local wireless connection via a protocol such as, e.g., Bluetooth or 802.11 X. IEEE 802.11a, b, g or n-compliant interface (see. e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a WCDMA, LTE, general packet radio service (GPRS) interface (see, e.g., Guidelines on GPRS Handset Requirements, Global System for Mobile Communications/GSM Association, Ver. 3.0.1, December 2002).

Electronic device 100 may further include one or more input/output interfaces such as, e.g., a keypad 136 and a display 138. In some embodiments electronic device 100 may not have a keypad and use the touch panel for input.

Memory 140 may include an operating system 142 for managing operations of electronic device 100. In one embodiment, operating system 142 includes a hardware interface module 154 that provides an interface to system hardware 120. In addition, operating system 140 may include a file system 150 that manages files used in the operation of electronic device 100 and a process control subsystem 152 that manages processes executing on electronic device 100.

Operating system 142 may include (or manage) one or more communication interfaces 146 that may operate in conjunction with system hardware 120 to transceive data packets and/or data streams from a remote source. Operating system 142 may further include a system call interface module 144 that provides an interface between the operating system 142 and one or more application modules resident in memory 130. Operating system 142 may be embodied as a UNIX operating system or any derivative thereof (e.g., Linux, Android, etc.) or as a Windows® brand operating system, or other operating systems.

In some embodiments an electronic device may include a controller 170, which may be separate from the primary execution environment. The separation may be physical in the sense that the controller may be implemented in controllers which are physically separate from the main processors. Alternatively, the separation may logical in the sense that the controller may be hosted on same chip or chipset that hosts the main processors.

By way of example, in some embodiments the controller 170 may be implemented as an independent integrated circuit located on the motherboard of the electronic device 100. e.g., as a dedicated processor block on the same SOC die. In other embodiments the controller 170 may be implemented on a portion of the processor(s) 122 that is segregated from the rest of the processor(s) using hardware enforced mechanisms In the embodiment depicted in FIG. 1 the controller 170 comprises a processor 172, a memory module 174, a control module 176, and an I/O interface 178. In some embodiments the memory module 174 may comprise a persistent flash memory module and the various functional modules may be implemented as logic instructions encoded in the persistent memory module. e.g., firmware or software. The I/O interface 178 may comprise a serial I/O module or a parallel I/O module. Because the controller 170 is separate from the main processor(s) 122 and operating system 142, the controller 170 may be made secure, i.e., inaccessible to hackers who typically mount software attacks from the host processor 122.

Described herein are embodiments of assemblies to connect a first section 162 of a chassis 160 for an electronic device 100 to a second section 164 of a chassis 160 for an electronic device 100. The various embodiments described herein enable the second section of the chassis to rotate with respect to the first section and to translate with respect to the first section contemporaneous with the rotation. Embodiments of assemblies will be described with reference to FIGS. 2, 3A-3G. 4A-4D, and 5A-5D.

Figure 2:
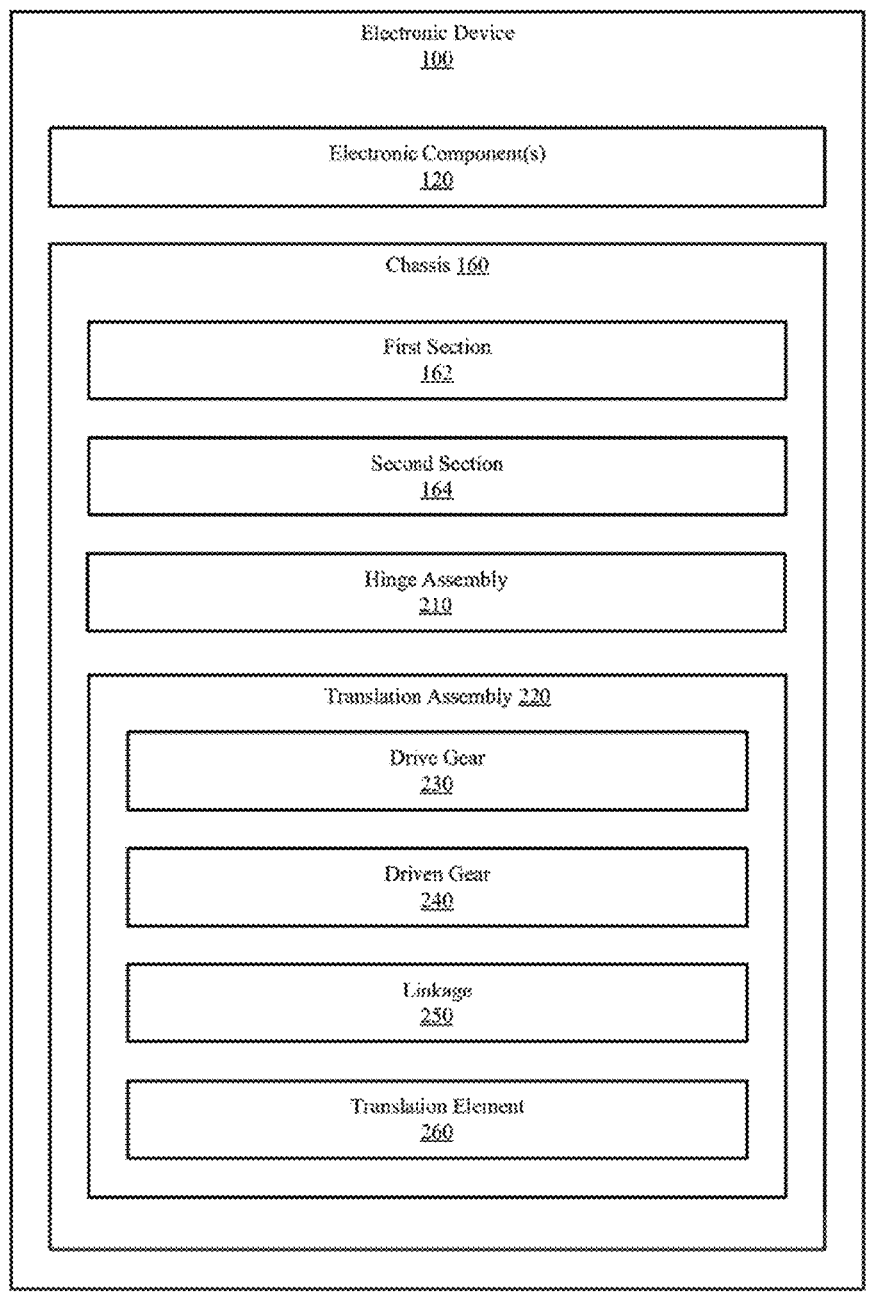
FIG. 2 is a schematic block diagram of an exemplary electronic device which may include a hinge assembly in accordance with some embodiments.

FIG. 2 is a schematic block diagram of an exemplary electronic device which nay include a hinge assembly in accordance with some embodiments. Referring to FIG. 2, in some embodiments an electronic device 100 comprises at least one electronic component 120, a chassis 160 comprising a first section 162 and a second section 164, a hinge assembly 210 to be coupled between the first section 162 of the chassis 160 and the second section 164 of the chassis 160 to allow rotation of the second section 164 of the chassis with respect to the first section 162 of the chassis, and a translation assembly 220 to be coupled to the hinge assembly 210 of the chassis 160 for the electronic device to allow translation of the second section 164 of the chassis with respect to the first section 162 of the chassis. The translation assembly 220 comprises a drive gear 230 coupled to the hinge assembly 210, a driven gear 240 coupled to the drive gear 230 by a linkage 250, and a translation element 260 coupled to the driven gear 230 to enable translation of the second section 164 of the chassis along an axis between a first position and a second position.

In operation, rotation of the hinge assembly 210 activates the translation assembly 220 to cause the second section 164 to translate with respect to the first section 162. This is illustrated in FIGS. 3A-3B. FIG. 3A illustrates the chassis 160 of the electronic device 100 in a closed configuration, while FIG. 3B illustrates the chassis 160 of the electronic device in an open configuration. Rotation of the second section 164 of the chassis 160 around the hinge assembly 210 induces the translation assembly to translate the second section 164 a distance (d) between a first position (FIG. 3A) and a second position (FIG. 3B).

A first embodiment will be described with reference to FIGS. 3C-3G. Referring to FIG. 3C-3G, in some embodiments a bracket 310 may be coupled to the hinge assembly 210 and adapted to receive the second section 164 of the electronic device 100. By way of example, in some embodiments the second section 164 of the electronic device may be a tablet computing device that may be removable from the bracket 310 to allow for independent operation of the device. In other embodiments the electronic device 100 may be a conventional laptop or notebook computing device and the second section 164 may comprise one or more displays.

Figure 3C:
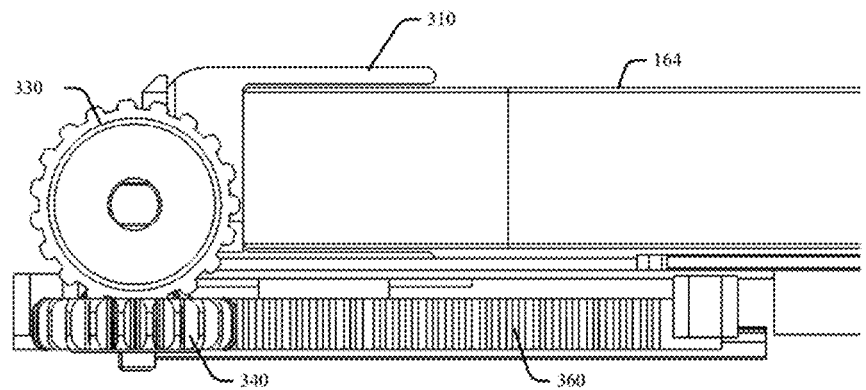
FIGS. 3C-3G are schematic illustrations of components of a hinge assembly in accordance with embodiments.
Figure 3D:
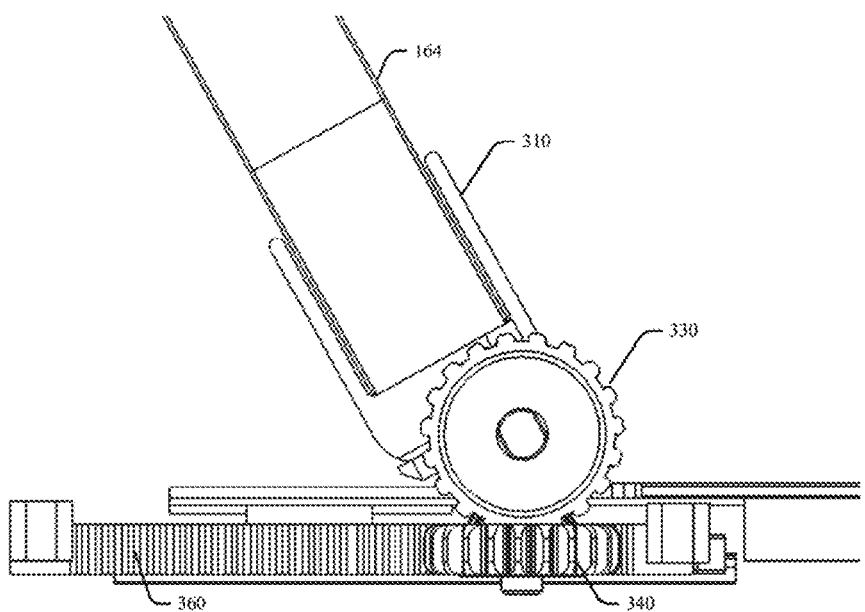
Figure 3E:
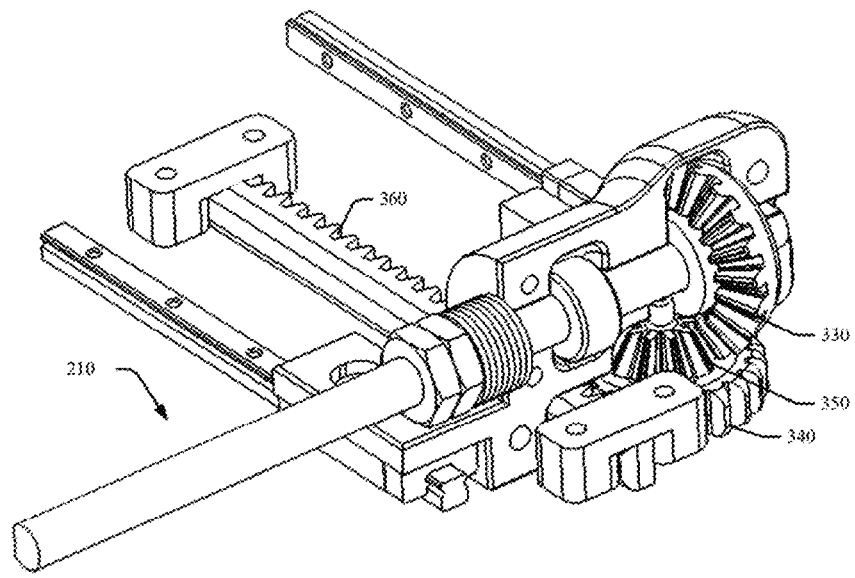
Figure 3F:
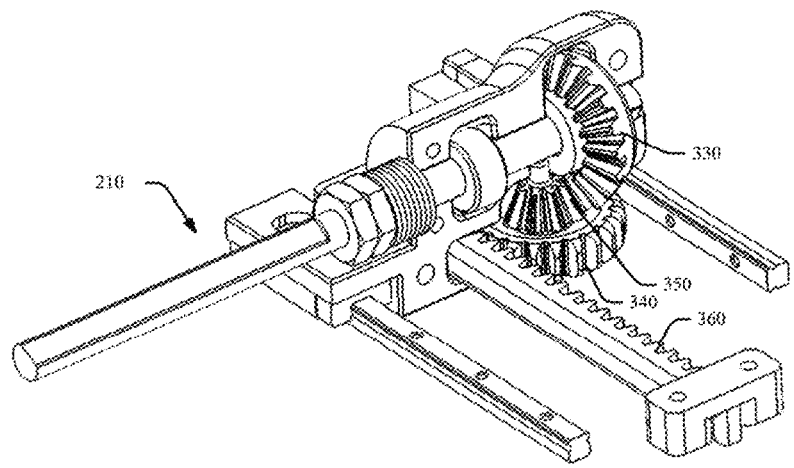
Figure 3G:
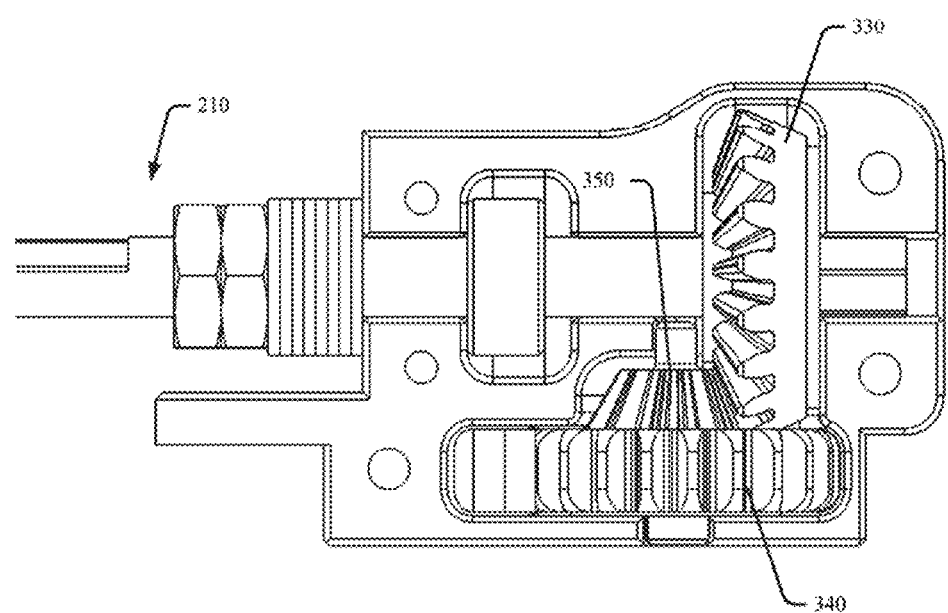
Figure 4A:
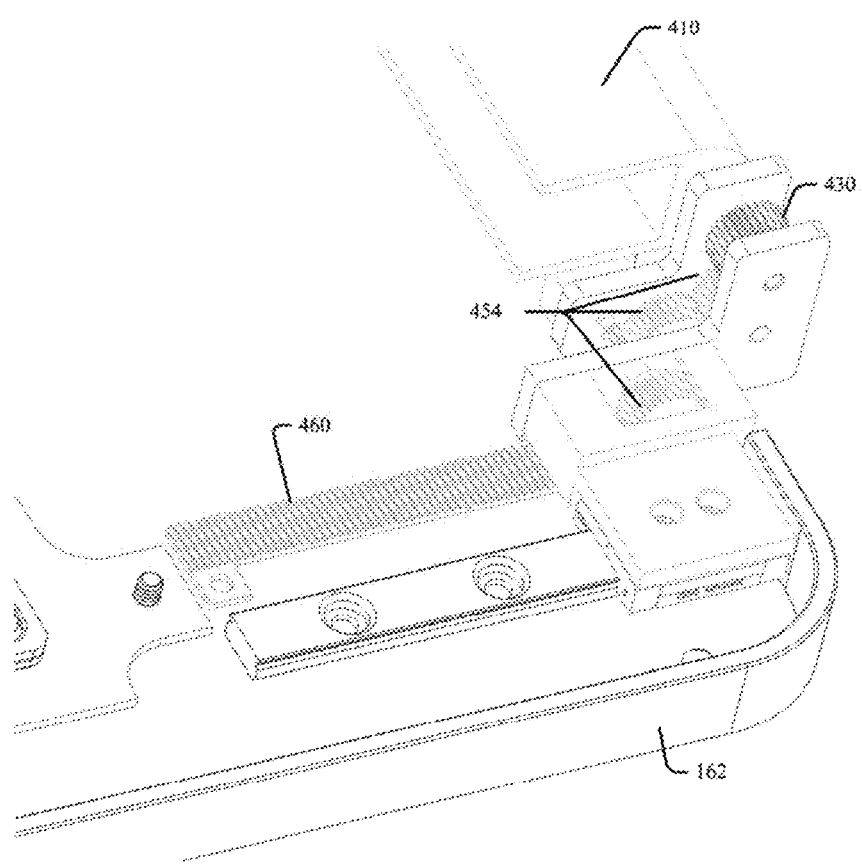
FIGS. 4A-4D are schematic illustrations of components of a hinge assembly in accordance with embodiments.
Figure 4B:
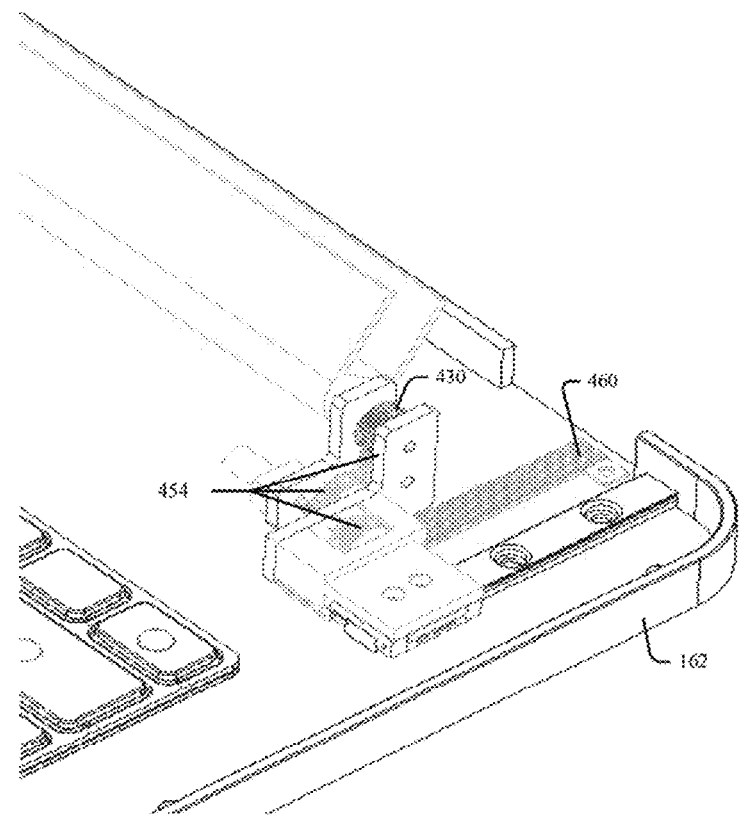
Figure 4C:
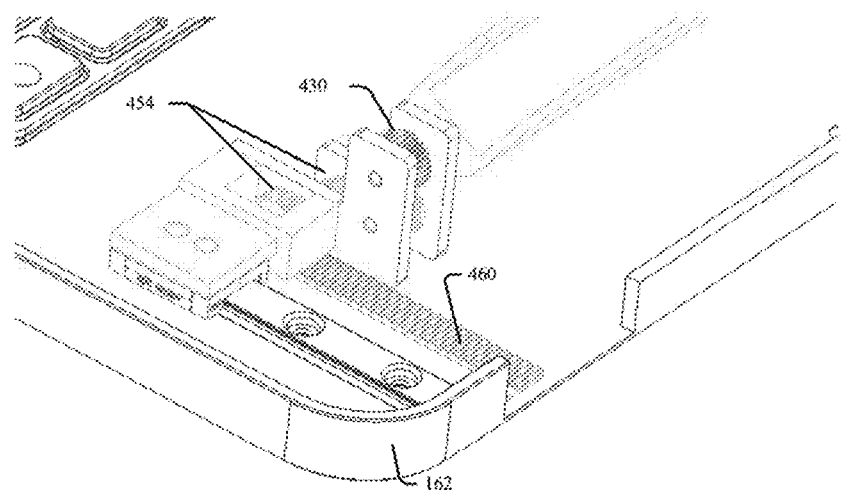
Figure 4D:
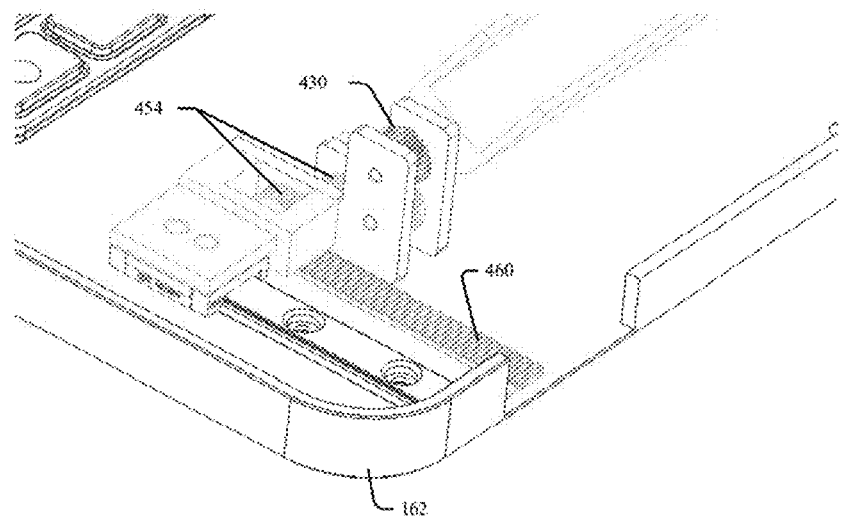

A first bevel gear 330 is coupled to the hinge assembly 210 such that rotation of the second section 164 about the hinge assembly 210 also rotates the first bevel gear 330. The first bevel gear 330 is coupled to a spur gear 340 by a second bevel gear 350, as illustrated in FIGS. 3E-3G. The spur gear 340 is coupled to a rack 360 which extends along an axis. The rack 360 may be fixed to the first section 162 of the housing 160. When driven by rotation of the first bevel gear 330, the spur gear 340 is translatable along the rack 360 between a first position (FIG. 3E) and a second position (FIG. 3F), thereby translating the second section 164 between the first position and the second position.

In some embodiments the first bevel gear 330 and the spur gear 340 are larger than the second bevel gear 350 such that the three gears act as a gear increaser which allows for relatively large translations of the second section 164 in response to relatively small rotations of about the hinge. By way of example, in some embodiments the assembly generates a translation of the second section 164 that measures 25.5 millimeters along the rack in response to a rotation of the second section 164 of approximately 120 degrees.

A second embodiment will be described with reference to FIGS. 4A-4D. Referring to FIG. 4A-4D, in some embodiments a bracket 410 may be coupled to the hinge assembly 210 and adapted to receive the second section 164 of the electronic device 100. As described above, in some embodiments the second section 164 of the electronic device may be a tablet computing device that may be removable from the bracket 410 to allow for independent operation of the device. In other embodiments the electronic device 100 may be a conventional laptop or notebook computing device and the second section 164 may comprise one or more displays.

A first rotating gear 430 is coupled to the hinge assembly 210 such that rotation of the second section 164 about the hinge assembly 210 also rotates the first rotating gear 430. The first rotating gear 430 is coupled to a second rotating gear 440 by a plurality of rotating gears 450, as illustrated in FIGS. 4A-4D. The second rotating gear 440 is coupled to a rack 460 which extends along an axis. The rack 460 may be fixed to the first section 162 of the housing 160. When driven by rotation of the first rotating gear 430, the second rotating gear 440 is translatable along the rack 460 between a first position (FIG. 4A) and a second position (FIG. 4B), thereby translating the second section 164 between the first position and the second position.

A third embodiment will be described with reference to FIGS. 5A-5E. Referring to FIGS. 5A-5E, in some embodiments a rotating drive gear 530 is coupled to the hinge assembly 210 that connects the first section 162 of the electronic device to the second section 164 of the electronic device. A the driven gear 540 is coupled to the drive gear 530 by a drive belt 550. In the embodiment depicted in FIGS. 5A-5E the drive belt 550 is depicted as a belt. One skilled in the art will recognize that the drive belt 550 could be embodied as a chain.

A connecting arm 560 rotatably coupled to the first section 162 of the chassis 160 at a first location and the second section 164 of the chassis 160 at a second location, displaced along an axis from the first location. In the embodiment depicted in FIGS. 5A-5E the connecting arm 560 is coupled to the second section 164 at the location of the drive gear 530 and to the first section at a location displaced from the location of the drive gear 530.

The first rotating gear 530 is coupled to the hinge assembly 210 such that rotation of the second section 164 about the hinge assembly 210 also rotates the first rotating gear 530. Rotation of the first rotating gear 530 drives the drive belt 550 which, in turn, rotates the driven gear 540. Rotation of the driven gear 540 causes the connecting arm 560 to pivot about its connection to the first section 162, as illustrated in FIGS. 5B-5E, thereby translating the second section 164 with respect to the first section 162 in response to rotation of the first section.

Figure 5A:
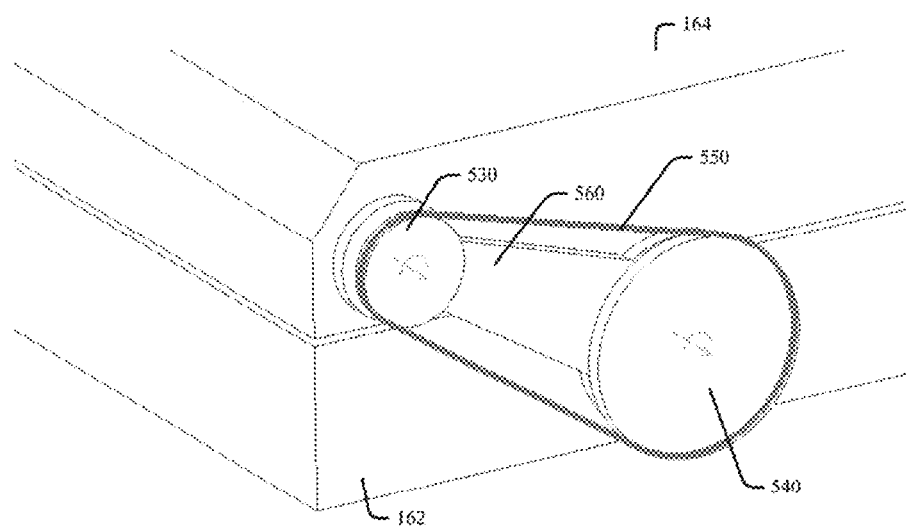
FIGS. 5A-5B are schematic illustrations of components of a hinge assembly in accordance with embodiments.
Figure 5B:
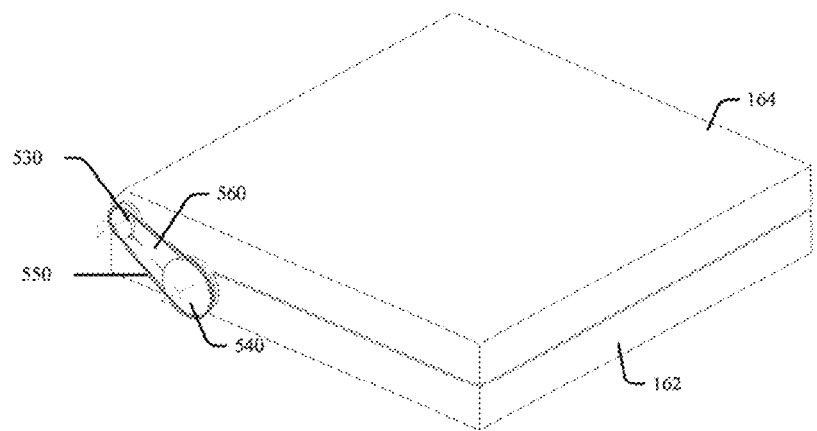
Figure 5C:
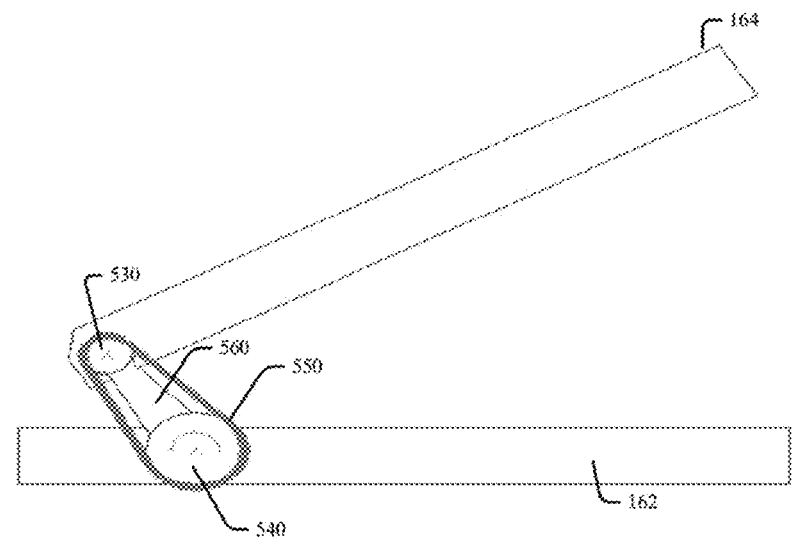
FIGS. 5C-5F are schematic illustrations of electronic devices which include a hinge assembly in accordance with some embodiments.
Figure 5D:
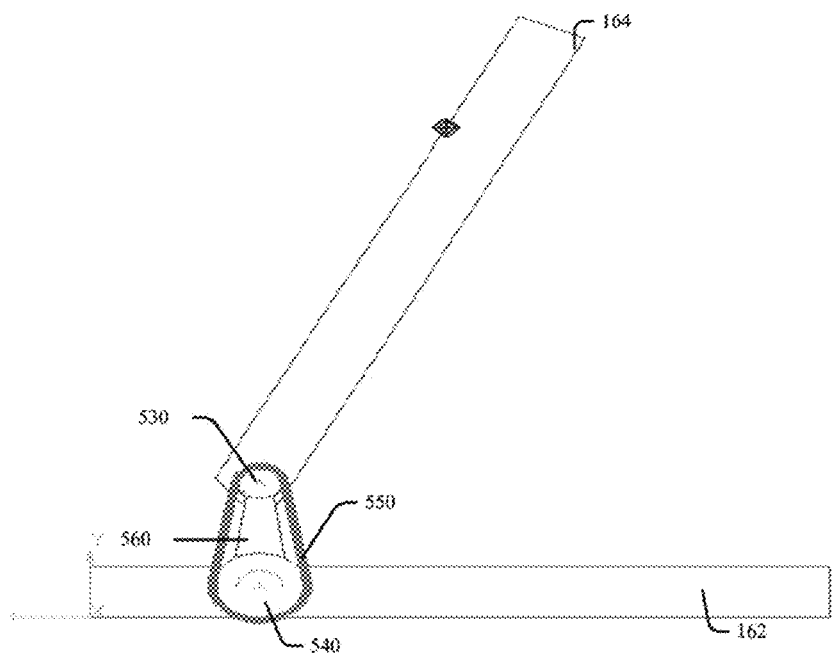
Figure 5E:
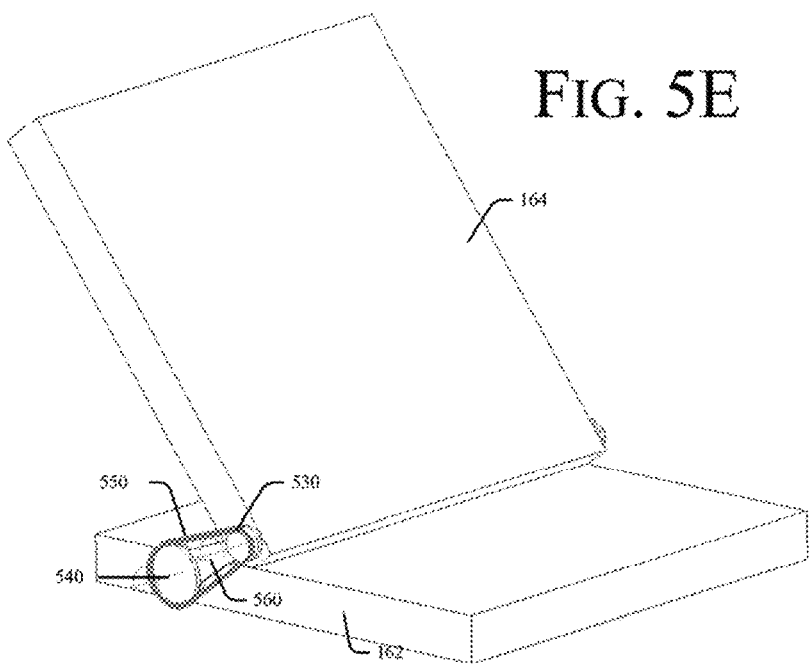
Figure 5F:
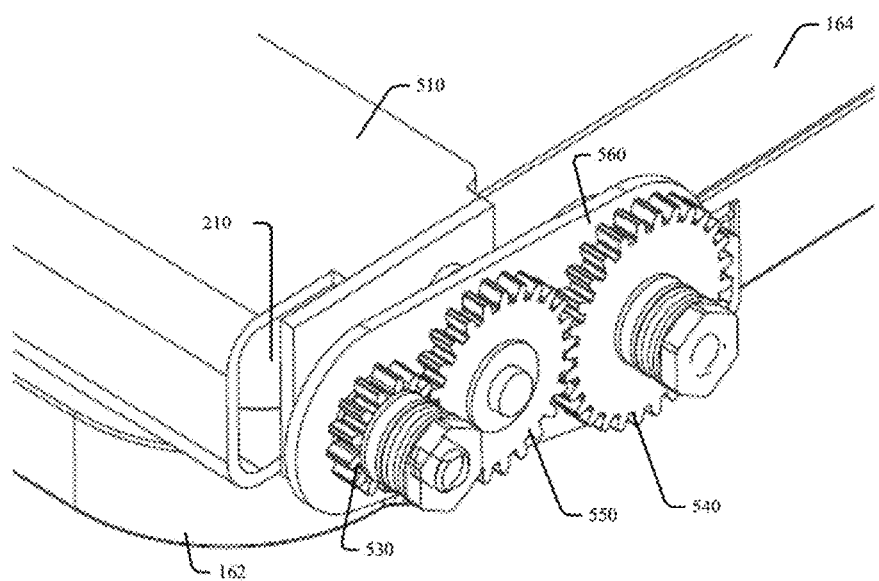

A fourth embodiment will be described with reference to FIG. 5F. Referring to FIG. 5F, in some embodiments a bracket 510 may be coupled to the hinge assembly 210 and adapted to receive the second section 164 of the electronic device 100. As described above, in some embodiments the second section 164 of the electronic device may be a tablet computing device that may be removable from the bracket 510 to allow for independent operation of the device. In other embodiments the electronic device 100 may be a conventional laptop or notebook computing device and the second section 164 may comprise one or more displays.

A first rotating gear 530 is coupled to the hinge assembly 210 such that rotation of the second section 164 about the hinge assembly 210 also rotates the first rotating gear 530. The first rotating gear 530 is coupled to a second rotating gear 540 by a third rotating gear 550, as illustrated in FIG. 5A.

A connecting arm 560 coupled to the first section 162 of the chassis 160 at a first location and the second section 164 of the chassis 160 at a second location, displaced along an axis from the first location. The first rotating gear 530 is coupled to the hinge assembly 210 such that rotation of the second section 164 about the hinge assembly 210 also rotates the first rotating gear 530. Rotation of the first rotating gear 530 drives the second rotating gear 550 which, in turn, rotates the driven gear 540. Rotation of the driven gear 540 causes the connecting arm 560 to pivot about its connection to the first section 162, as illustrated in FIGS. 5B-5E, thereby translating the second section 164 with respect to the first section 162 in response to rotation of the first section.

Figure 6:
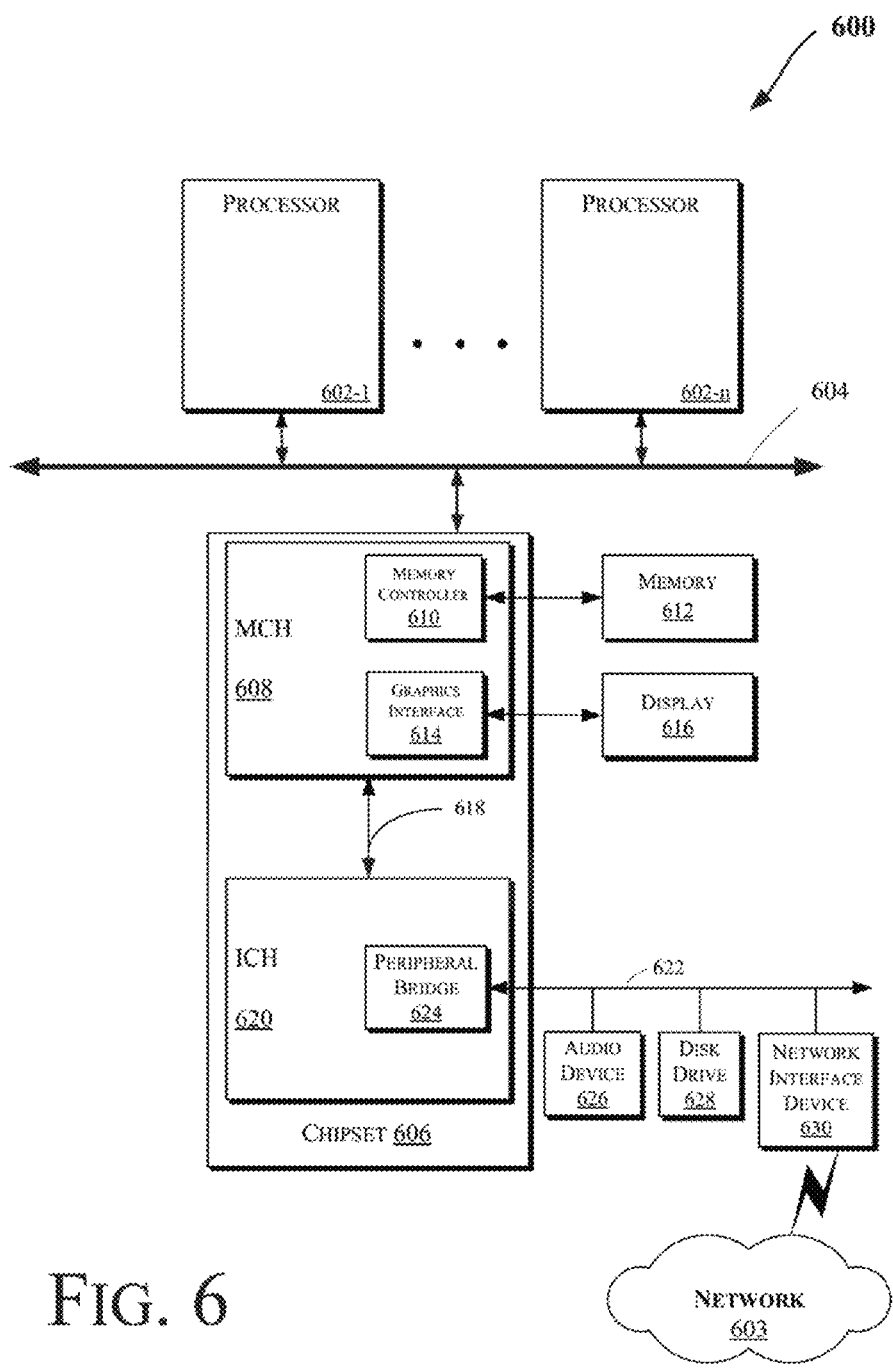
FIGS. 6-10 are schematic illustrations of electronic devices which may be modified to include a hinge assembly in accordance with some embodiments.

As described above, in some embodiments the electronic device may be embodied as a computer system. FIG. 6 illustrates a block diagram of a computing system 600 in accordance with an embodiment of the invention. The computing system 600 may include one or more central processing unit(s) (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an embodiment, one or more of the processors 602 may be the same or similar to the processors 102 of FIG. 1. For example, one or more of the processors 602 may include the control unit 120 discussed with reference to FIGS. 1-3. Also, the operations discussed with reference to FIGS. 3-5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the CPU 602, or any other device included in the computing system 600. In one embodiment of the invention, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple CPUs and/or multiple system memories.

The MCH 608 may also include a graphics interface 614 that communicates with a display device 616. In one embodiment of the invention, the graphics interface 614 may communicate with the display device 616 via an accelerated graphics port (AGP). In an embodiment of the invention, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some embodiments of the invention. In addition, the processor 602 and one or more other components discussed herein may be combined to form a single chip (e.g., to provide a System on Chip (SOC)). Furthermore, the graphics accelerator 616 may be included within the MCH 608 in other embodiments of the invention.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
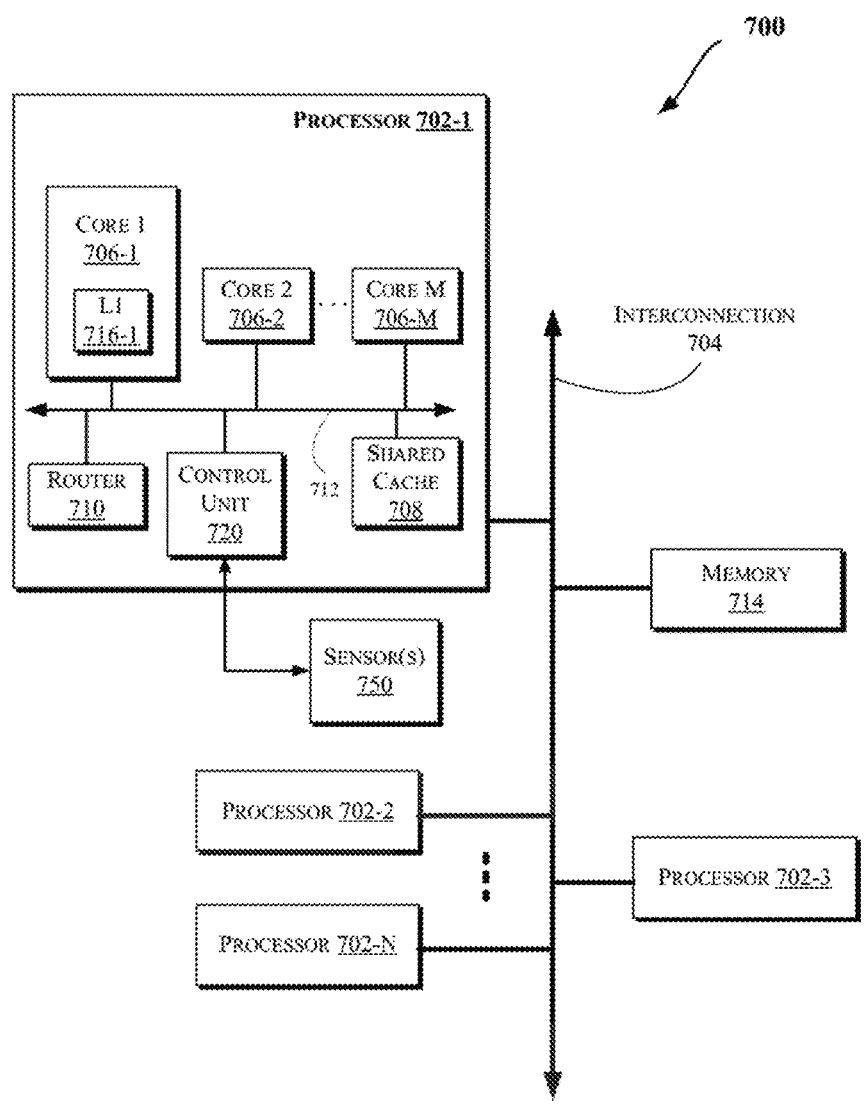

FIG. 7 illustrates a block diagram of a computing system 700, according to an embodiment of the invention. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an embodiment, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one embodiment, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an embodiment, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some embodiments, one or more of the cores 706 may include a level 1 (L1) cache 716-1 (generally referred to herein as "L1 cache 716"). In one embodiment, the controller 720 may include logic to implement the operations described above with reference to FIG. 3.

Figure 8:
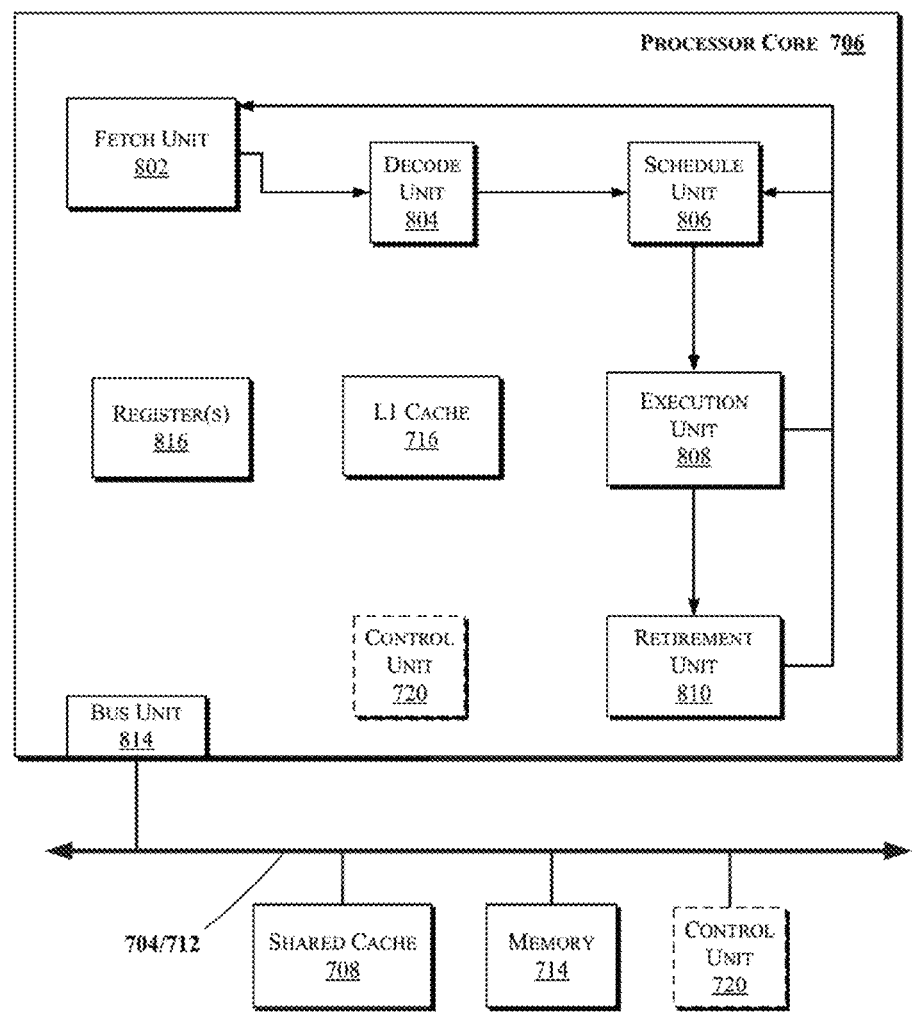

FIG. 8 illustrates a block diagram of portions of a processor core 706 and other components of a computing system, according to an embodiment of the invention. In one embodiment, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of aops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one embodiment, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an embodiment, the execution unit 808 may include more than one execution unit. The execution unit 808 may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit 808.

Further, the execution unit 808 may execute instructions out-of-order. Hence, the processor core 706 may be an out-of-order processor core in one embodiment. The core 706 may also include a retirement unit 810. The retirement unit 810 may retire executed instructions after they are committed. In an embodiment, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various embodiments the control unit 720 may be located elsewhere such as inside the core 706, coupled to the core via bus 704, etc.

Figure 9:
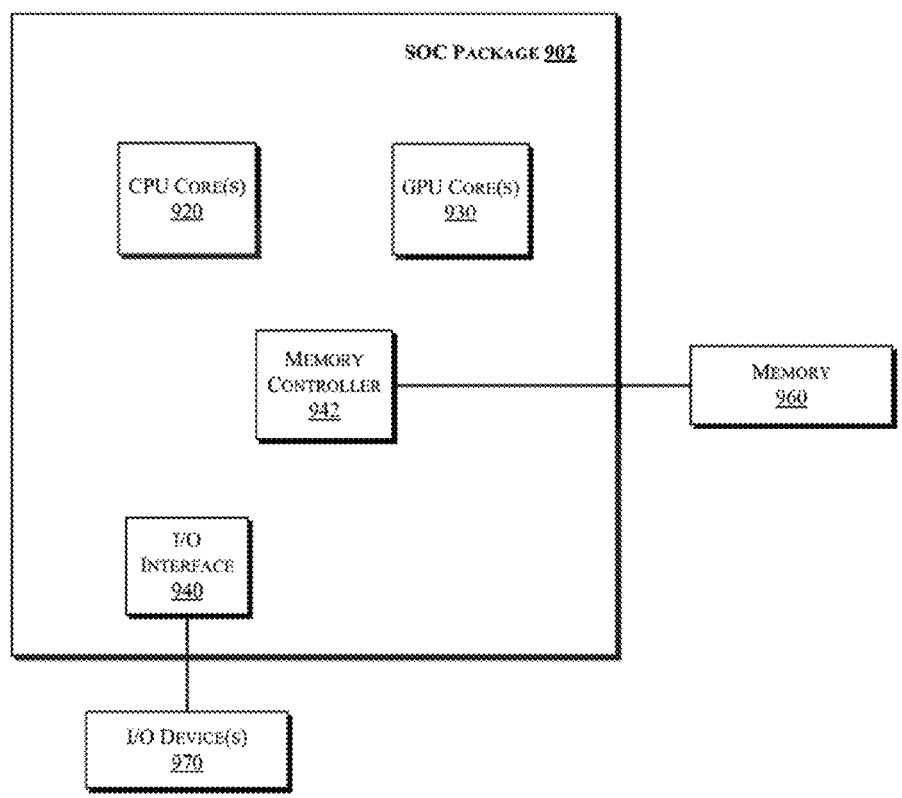

In some embodiments, one or more of the components discussed herein can be embodied as a System On Chip (SOC) device. FIG. 9 illustrates a block diagram of an SOC package in accordance with an embodiment. As illustrated in FIG. 9, SOC 902 includes one or more Central Processing Unit (CPU) cores 920, one or more Graphics Processor Unit (GPU) cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one embodiment, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an embodiment, the memory 960 (or a portion of it) can be integrated on the SOC package 902.

The I/O interface 940 may be coupled to one or more I/O devices 970. e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch screen, a speaker, or the like.

Figure 10:
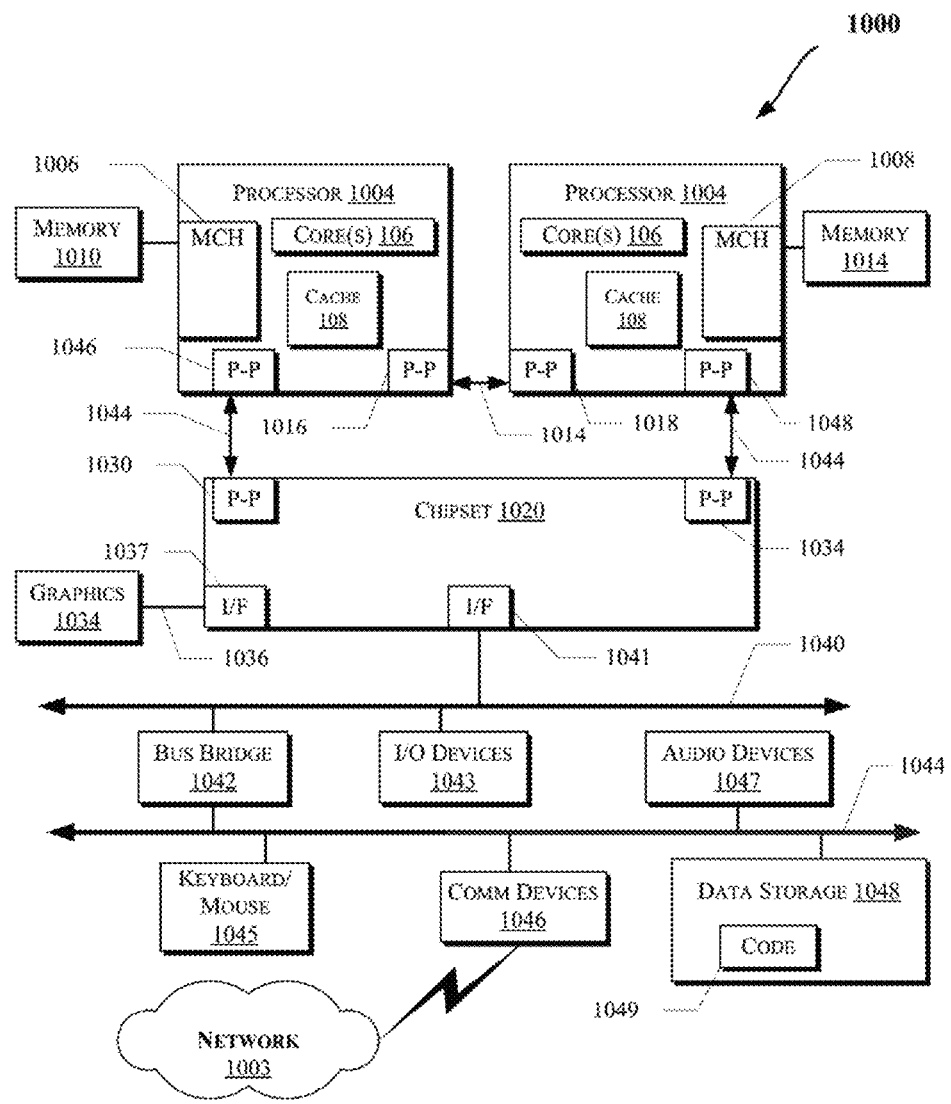

FIG. 10 illustrates a computing system 1000 that is arranged in a point-to-point (PtP) configuration, according to an embodiment of the invention. In particular, FIG. 10 shows a system where processors, memory, and input/output devices are interconnected by a number of point-to-point interfaces.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic 125 of FIG. 1 in some embodiments.

In an embodiment, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 1004. Other embodiments of the invention, however, may exist in other circuits, logic units, or devices within the system 1000 of FIG. 10. Furthermore, other embodiments of the invention may be distributed throughout several circuits, logic units, or devices illustrated in FIG. 10.

The chipset 1020 may communicate with a bus 1040 using a PtP interface circuit 1041. The bus 1040 may have one or more devices that communicate with it, such as a bus bridge 1042 and I/O devices 1043. Via a bus 1044, the bus bridge 1043 may communicate with other devices such as a keyboard/mouse 1045, communication devices 1046 (such as modems, network interface devices, or other communication devices that may communicate with the computer network 1003), audio I/O device, and/or a data storage device 1048. The data storage device 1048 (which may be a hard disk drive or a NAND flash based solid state drive) may store code 1049 that may be executed by the processors 1004.

The following examples pertain to further embodiments.

Example 1 is an assembly to connect a first section 162 of a chassis 160 for an electronic device 100 to a second section 164 of a chassis 160 for the electronic device 100, comprising a hinge assembly 210 to be coupled between the first section 162 of the chassis 160 and the second section 164 of the chassis 160 to allow rotation of the second section 164 of the chassis with respect to the first section 162 of the chassis, and a translation assembly 220 to be coupled to the hinge assembly 210 of the chassis 160 for the electronic device to allow translation of the second section 164 of the chassis with respect to the first section 162 of the chassis, wherein rotation of the hinge assembly 210 activates the translation assembly 220.

In Example 2, the subject matter of Example 1 can optionally include a drive gear 230 coupled to the hinge assembly 210, a driven gear 240 coupled to the drive gear 230 by a linkage 250, and a translation element 260 coupled to the driven gear 230 to enable translation of the second section 164 of the chassis along an axis between a first position and a second position.

In Example 3, the subject matter of any one of Examples 1-2 can optionally include a drive gear 230 which comprises a first bevel gear 330, a driven gear 240 which comprises a spur gear 340, a translation element 260 which comprises a rack 360 extending along an axis and coupled to the spur gear 340, wherein the spur gear 340 is translatable along the rack 360 between a first position and a second position, and a linkage 250 which comprises second bevel gear 350 coupled to the first bevel gear 330 and the spur gear 340.

In Example 4, the subject matter of any one of Examples 1-3 can optionally include a first bevel gear 330 which is larger than the second bevel gear 350.

In Example 4, the subject matter of any one of Examples 1-3 can optionally include a drive gear 230 which comprises a first rotating gear 430, a driven gear 240 which comprises a second rotating gear 440, a translation element 260 which comprises a rack 460 extending along an axis, wherein the second rotating gear 440 is translatable along the rack 460 between a first position and a second position, and a linkage 250 which comprises a plurality of rotating gears 450 coupled to the first rotating gear 430 and the second rotating gear 440.

In Example 6, the subject matter of any one of Examples 1-5 can optionally include a drive gear 230 which comprises a first rotating gear 530, a driven gear 240 which comprises a second rotating gear 540, a translation element 260 which comprises a connecting arm 560 coupled to the first section 162 of the chassis 160 at a first location and the second section 164 of the chassis 160 at a second location, displaced along an axis from the first location, and a linkage 250 which comprises a third rotating gear 550 coupled to the first rotating gear 530 and the second gear 540.

In Example 7, the subject matter of any one of Examples 1-6 can optionally include 7a drive gear 230 which comprises a first rotating gear 530, a driven gear 240 which comprises a second rotating gear 540, a translation element 260 which comprises a connecting arm 560 coupled to the first section 162 of the chassis 160 at a first location and the second section 164 of the chassis 160 at a second location, displaced along an axis from the first location, and a linkage 250 which comprises a drive belt 550 coupled to the first rotating gear 530 and the second rotating gear 540.

Example 8 is a chassis for an electronic device, comprising a first section 162 and a second section, and an assembly to connect a first section 162 of a chassis 160 for an electronic device 100 to a second section 164 of a chassis 160 for the electronic device 100, comprising a hinge assembly 210 to be coupled between the first section 162 of the chassis 160 and the second section 164 of the chassis 160 to allow rotation of the second section 164 of the chassis with respect to the first section 162 of the chassis, and a translation assembly 220 to be coupled to the hinge assembly 210 of the chassis 160 for the electronic device to allow translation of the second section 164 of the chassis with respect to the first section 162 of the chassis, wherein rotation of the hinge assembly 210 activates the translation assembly 220.

In Example 9, the subject matter of Example 8 can optionally include a drive gear 230 coupled to the hinge assembly 210, a driven gear 240 coupled to the drive gear 230 by a linkage 250, and a translation element 260 coupled to the driven gear 230 to enable translation of the second section 164 of the chassis along an axis between a first position and a second position.

In Example 10, the subject matter of any one of Examples 8-9 can optionally include a drive gear 230 which comprises a first bevel gear 330, a driven gear 240 which comprises a spur gear 340, a translation element 260 which comprises a rack 360 extending along an axis and coupled to the spur gear 340, wherein the spur gear 340 is translatable along the rack 360 between a first position and a second position, and a linkage 250 which comprises second bevel gear 350 coupled to the first bevel gear 330 and the spur gear 340.

In Example 11, the subject matter of any one of Examples 8-10 can optionally include a first bevel gear 330 which is larger than the second bevel gear 350.

In Example 12, the subject matter of any one of Examples 8-11 can optionally include a drive gear 230 which comprises a first rotating gear 430, a driven gear 240 which comprises a second rotating gear 440, a translation element 260 which comprises a rack 460 extending along an axis, wherein the second rotating gear 440 is translatable along the rack 460 between a first position and a second position, and a linkage 250 which comprises a plurality of rotating gears 450 coupled to the first rotating gear 430 and the second rotating gear 440.

In Example 13, the subject matter of any one of Examples 8-12 can optionally include a drive gear 230 which comprises a first rotating gear 530, a driven gear 240 which comprises a second rotating gear 540, a translation element 260) which comprises a connecting arm 560 coupled to the first section 162 of the chassis 160 (at a first location and the second section 164 of the chassis 160 at a second location, displaced along an axis from the first location, and a linkage 250 which comprises a third rotating gear 550 coupled to the first rotating gear 530 and the second gear 540.

In Example 14, the subject matter of any one of Examples 8-13 can optionally include a drive gear 230 which comprises a first rotating gear 530, a driven gear 240 which comprises a second rotating gear 540, a translation element 260 which comprises a connecting arm 560 coupled to the first section 162 of the chassis 160 at a first location and the second section 164 of the chassis 160 at a second location, displaced along an axis from the first location, and a linkage 250 which comprises a drive belt 550 coupled to the first rotating gear 530 and the second rotating gear 540.

Example 15 is an electronic device comprising at least one electronic component, a chassis comprising a first section 162 and a second section 164, and an assembly to connect a first section 162 of a chassis 160 for an electronic device 100 to a second section 164 of a chassis 160 for the electronic device 100, comprising a hinge assembly 210 to be coupled between the first section 162 of the chassis 160 and the second section 164 of the chassis 160 to allow rotation of the second section 164 of the chassis with respect to the first section 162 of the chassis, and a translation assembly 220 to be coupled to the hinge assembly 210 of the chassis 160 for the electronic device to allow translation of the second section 164 of the chassis with respect to the first section 162 of the chassis, wherein rotation of the hinge assembly 210 activates the translation assembly 220.

In Example 16, the subject matter of Example 15 can optionally include a drive gear 230 coupled to the hinge assembly 210, a driven gear 240 coupled to the drive gear 230 by a linkage 250, and a translation element 260 coupled to the driven gear 230 to enable translation of the second section 164 of the chassis along an axis between a first position and a second position.

In Example 17, the subject matter of any one of Examples 15-16 can optionally include a drive gear 230 which comprises a first bevel gear 330, a driven gear 240 which comprises a spur gear 340, a translation element 260 which comprises a rack 360 extending along an axis and coupled to the spur gear 340, wherein the spur gear 340 is translatable along the rack 360 between a first position and a second position, and a linkage 250 which comprises second bevel gear 350 coupled to the first bevel gear 330 and the spur gear 340.

In Example 18, the subject matter of any one of Examples 15-17 can optionally include a first bevel gear 330 which is larger than the second bevel gear 350.

In Example 19, the subject matter of any one of Examples 15-18 can optionally include a drive gear 230 which comprises a first rotating gear 430, a driven gear 240 which comprises a second rotating gear 440, a translation element 260 which comprises a rack 460 extending along an axis, wherein the second rotating gear 440 is translatable along the rack 460 between a first position and a second position, and a linkage 250 which comprises a plurality of rotating gears 450 coupled to the first rotating gear 430 and the second rotating gear 440.

In Example 20, the subject matter of any one of Examples 15-19 can optionally include a drive gear 230 which comprises a first rotating gear 530, a driven gear 240 which comprises a second rotating gear 540, a translation element 260 which comprises a connecting arm 560 coupled to the first section 162 of the chassis 160 at a first location and the second section 164 of the chassis 160 at a second location, displaced along an axis from the first location, and a linkage 250 which comprises a third rotating gear 550 coupled to the first rotating gear 530 and the second gear 540.

In Example 21, the subject matter of any one of Examples 15-20 can optionally include a drive gear 230 which comprises a first rotating gear 530, a driven gear 240 which comprises a second rotating gear 540, a translation element 260 which comprises a connecting arm 560 coupled to the first section 162 of the chassis 160 at a first location and the second section 164 of the chassis 160 at a second location, displaced along an axis from the first location, and a linkage 250 which comprises a drive belt 550 coupled to the first rotating gear 530 and the second rotating gear 540.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and embodiments are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and embodiments are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and embodiments are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" or "some embodiments" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An assembly to connect a first section of a chassis for an electronic device to a second section of a chassis for the electronic device, comprising:
    a hinge assembly to be coupled between the first section of the chassis and the second section of the chassis to allow rotation of the second section of the chassis with respect to the first section of the chassis; and
    a translation assembly to be coupled to the hinge assembly of the chassis for the electronic device to allow translation of the second section of the chassis with respect to the first section of the chassis;
    wherein rotation of the hinge assembly activates the translation assembly.

2. The assembly of claim 1, wherein the translation assembly comprises:
    a drive gear coupled to the hinge assembly;
    a driven gear coupled to the drive gear by a linkage; and
    a translation element coupled to the driven gear to enable translation of the second section of the chassis along an axis between a first position and a second position.

3. The assembly of claim 2, wherein:
    the drive gear comprises a first bevel gear;
    the driven gear comprises a spur gear;
    the translation element comprises a rack extending along an axis and coupled to the spur gear, wherein the spur gear is translatable along the rack between a first position and a second position; and
    the linkage comprises second bevel gear coupled to the first bevel gear and the spur gear.

4. The assembly of claim 3, wherein the first bevel gear is larger than the second bevel gear.

5. The assembly of claim 2, wherein:
    the drive gear comprises a first rotating gear;
    the driven gear comprises a second rotating gear;
    the translation element comprises a rack extending along an axis, wherein the second rotating gear is translatable along the rack between a first position and a second position; and
    the linkage comprises a plurality of rotating gears coupled to the first rotating gear and the second rotating gear.

6. The assembly of claim 2, wherein:
    the drive gear comprises a first rotating gear;
    the driven gear comprises a second rotating gear;
    the translation element comprises a connecting arm coupled to the first section of the chassis at a first location and the second section of the chassis at a second location, displaced along an axis from the first location; and
    the linkage comprises a third rotating gear coupled to the first rotating gear and the second gear.

7. The assembly of claim 2, wherein:
the drive gear comprises a first rotating gear;
the driven gear comprises a second rotating gear;
the translation element comprises a connecting arm coupled to the first section of the chassis at a first location and the second section of the chassis at a second location, displaced along an axis from the first location; and
the linkage comprises a drive belt coupled to the first rotating gear and the second rotating gear.

8. A chassis for an electronic device, comprising:
a first section and a second section; and
an assembly to connect the first section of the chassis to the second section of the chassis, comprising:
 a hinge assembly to be coupled between the first section of the chassis and the second section of the chassis to allow rotation of the second section of the chassis with respect to the first section of the chassis; and
 a translation assembly to be coupled to the hinge assembly of the chassis for the electronic device to allow translation of the second section of the chassis with respect to the first section of the chassis;
 wherein rotation of the hinge assembly activates the translation assembly.

9. The chassis of claim 8, wherein the translation assembly comprises:
a drive gear coupled to the hinge assembly;
a driven gear coupled to the drive gear by a linkage; and
a translation element coupled to the driven gear to enable translation of the second section of the chassis along an axis between a first position and a second position.

10. The chassis of claim 9, wherein:
the drive gear comprises a first bevel gear;
the driven gear comprises a spur gear;
the translation element comprises a rack extending along an axis and coupled to the spur gear, wherein the spur gear is translatable along the rack between a first position and a second position; and
the linkage comprises second bevel gear coupled to the first bevel gear and the spur gear.

11. The chassis of claim 10, wherein the first bevel gear is larger than the second bevel gear.

12. The chassis of claim 9, wherein:
the drive gear comprises a first rotating gear;
the driven gear comprises a second rotating gear;
the translation element comprises a rack extending along an axis, wherein the second rotating gear is translatable along the rack between a first position and a second position; and
the linkage comprises a plurality of rotating gears coupled to the first rotating gear and the second rotating gear.

13. The chassis of claim 9, wherein:
the drive gear comprises a first rotating gear;
the driven gear comprises a second rotating gear;
the translation element comprises a connecting arm coupled to the first section of the chassis at a first location and the second section of the chassis at a second location, displaced along an axis from the first location; and
the linkage comprises a third rotating gear coupled to the first rotating gear and the second gear.

14. The chassis of claim 9, wherein:
the drive gear comprises a first rotating gear;
the driven gear comprises a second rotating gear;
the translation element comprises a connecting arm coupled to the first section of the chassis at a first location and the second section of the chassis at a second location, displaced along an axis from the first location; and
the linkage comprises a drive belt coupled to the first rotating gear and the second rotating gear.

15. An electronic device, comprising:
at least one electronic component;
a chassis comprising a first section and a second section; and
an assembly to connect the first section of the chassis to the second section of the chassis, comprising:
 a hinge assembly to be coupled between the first section of the chassis and the second section of the chassis to allow rotation of the second section of the chassis with respect to the first section of the chassis; and
 a translation assembly to be coupled to the hinge assembly of the chassis for the electronic device to allow translation of the second section of the chassis with respect to the first section of the chassis;
 wherein rotation of the hinge assembly activates the translation assembly.

16. The electronic device of claim 15, wherein the translation assembly comprises:
a drive gear coupled to the hinge assembly;
a driven gear coupled to the drive gear by a linkage; and
a translation element coupled to the driven gear to enable translation of the second section of the chassis along an axis between a first position and a second position.

17. The electronic device of claim 16, wherein:
the drive gear comprises a first bevel gear;
the driven gear comprises a spur gear;
the translation element comprises a rack extending along an axis and coupled to the spur gear, wherein the spur gear is translatable along the rack between a first position and a second position; and
the linkage comprises second bevel gear coupled to the first bevel gear and the spur gear.

18. The electronic device of claim 17, wherein the first bevel gear is larger than the second bevel gear.

19. The electronic device of claim 16, wherein:
the drive gear comprises a first rotating gear;
the driven gear comprises a second rotating gear;
the translation element comprises a rack extending along an axis, wherein the second rotating gear is translatable along the rack between a first position and a second position; and
the linkage comprises a plurality of rotating gears coupled to the first rotating gear and the second rotating gear.

20. The electronic device of claim 16, wherein:
the drive gear comprises a first rotating gear;
the driven gear comprises a second rotating gear;
the translation element comprises a connecting arm coupled to the first section of the chassis at a first location and the second section of the chassis at a second location, displaced along an axis from the first location; and
the linkage comprises a third rotating gear coupled to the first rotating gear and the second gear.

21. The electronic device of claim 16, wherein:
the drive gear comprises a first rotating gear;
the driven gear comprises a second rotating gear;
the translation element comprises a connecting arm coupled to the first section of the chassis at a first location and the second section of the chassis at a second location, displaced along an axis from the first location; and the linkage comprises a drive belt coupled to the first rotating gear and the second rotating gear.

* * * * *